United States Patent
Cranford, Jr. et al.

(10) Patent No.: US 7,391,271 B2
(45) Date of Patent: Jun. 24, 2008

(54) ADJUSTMENT OF PLL BANDWIDTH FOR JITTER CONTROL USING FEEDBACK CIRCUITRY

(75) Inventors: Hayden C Cranford, Jr., Cary, NC (US); Ram Kelkar, South Burlington, VT (US); Anjali R Malladi, South Burlington, VT (US); Martin L Schmatz, Rueschlikon (CH); Nina A Shah, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 11/425,752

(22) Filed: Jun. 22, 2006

(65) Prior Publication Data

US 2008/0007345 A1    Jan. 10, 2008

(51) Int. Cl.
*H03L 7/00* (2006.01)
(52) U.S. Cl. .............................. 331/17; 331/16; 331/44
(58) Field of Classification Search ................ 331/16, 331/17, 44
See application file for complete search history.

(56) References Cited

U.S. PATENT DOCUMENTS

| 6,608,826 | B1 | 8/2003 | Mesecher et al. |
| 6,724,265 | B2 * | 4/2004 | Humphreys ............... 331/17 |
| 6,825,733 | B1 | 11/2004 | Qu et al. |
| 2003/0165209 | A1 | 9/2003 | Chen et al. |
| 2004/0202271 | A1 | 10/2004 | Fahim |

FOREIGN PATENT DOCUMENTS

EP    0571853    12/1993
WO    WO9517043    6/1995

* cited by examiner

*Primary Examiner*—Joseph Chang
(74) *Attorney, Agent, or Firm*—Joscelyn G. Cockburr; Jeanne E. Longmuir; Driggs, Hogg, Daugherty & Del Zoppo

(57) ABSTRACT

Jitter method and control circuit for a circuit block in a transceiver system having a phase lock loop circuit which includes an oscillator, a charge pump connected to the oscillator to add or subtract charge to or from said oscillator, and a low pass filter connected to said charge pump are provided. Circuitry is connected to the output of the oscillator and the input of the charge pump to control the amount of charge added to or subtracted from the charge pump to control the bandwidth output by the oscillator and thereby reduce jitter in the phase lock circuit.

11 Claims, 3 Drawing Sheets

ADJUSTMENT OF PLL BANDWIDTH FOR JITTER CONTROL USING FEEDBACK CIRCUITRY

FIELD OF THE INVENTION

This invention relates to a circuit and method to control jitter in a phase lock loop (PLL) in a transceiver system and, more particularly, to a circuit and method of controlling jitter in a (PLL) for a clock in a transceiver system.

BACKGROUND OF THE INVENTION

Steep increases in speeds in communication channels, along with lower bit error rate tolerances, impose tighter jitter requirements for most circuit blocks in a transceiver system. Time domain jitter has a direct impact on the bit error rate and eye closure in a transmitter. One of the sources of jitter is the clock path. The clock generator or clock recovery Phase Locked Loop (PLL) circuits contribute to that. Minimizing clock jitter can greatly reduce eye closure and help achieve higher bit error rates. In case of standard parts, the system is designed for a broad variety of reference clock oscillators as an input to the PLL, and the PLLs are not customized for a particular application. The bandwidth of the PLL has a direct impact on the clock jitter. If the PLL bandwidth can be adaptive, it can reduce the overall system jitter. This application discusses a technique for measuring the phase noise of the oscillator clock and using that as a figure of merit to modulate the PLL bandwidth to reduce the overall system jitter and, hence, enhancing the system performance.

In a charge pump based PLL, the bandwidth is controlled by the value of the current output of the charge pump, the value of the zero (adding) resistor in the loop filter and the gain of the oscillator. In this application, a technique is provided wherein the phase noise of the oscillator clock is measured and the output is manipulated to alter the current of the charge pump in order to achieve an optimal PLL bandwidth. This, in turn, helps reduce overall clock path and system jitter. Commonly owned patent application Ser. No. 10/707,121, filed Nov. 21, 2003, entitled VARIATION OF EFFECTIVE FILTER CAPACITANCE IN PLL LOOP FILTERS, incorporated by reference, explains in greater detail the procedure and benefit of changing the charge pump current inside a PLL.

SUMMARY OF THE INVENTION

Jitter method and control circuit for a circuit block in a transceiver system having a phase lock loop circuit which includes an oscillator, a charge pump connected to said oscillator to add or subtract charge to or from said oscillator, and a low pass filter connected to said charge pump are provided. Circuitry is connected to the output of said oscillator and the input of the charge pump to control the amount of charge added to or subtracted from the charge pump to control the bandwidth output by the oscillator and thereby reduce jitter in the phase lock circuit.

DETAILED DESCRIPTION OF THE PREFERRED EMBODIMENT(S)

Figure 1:
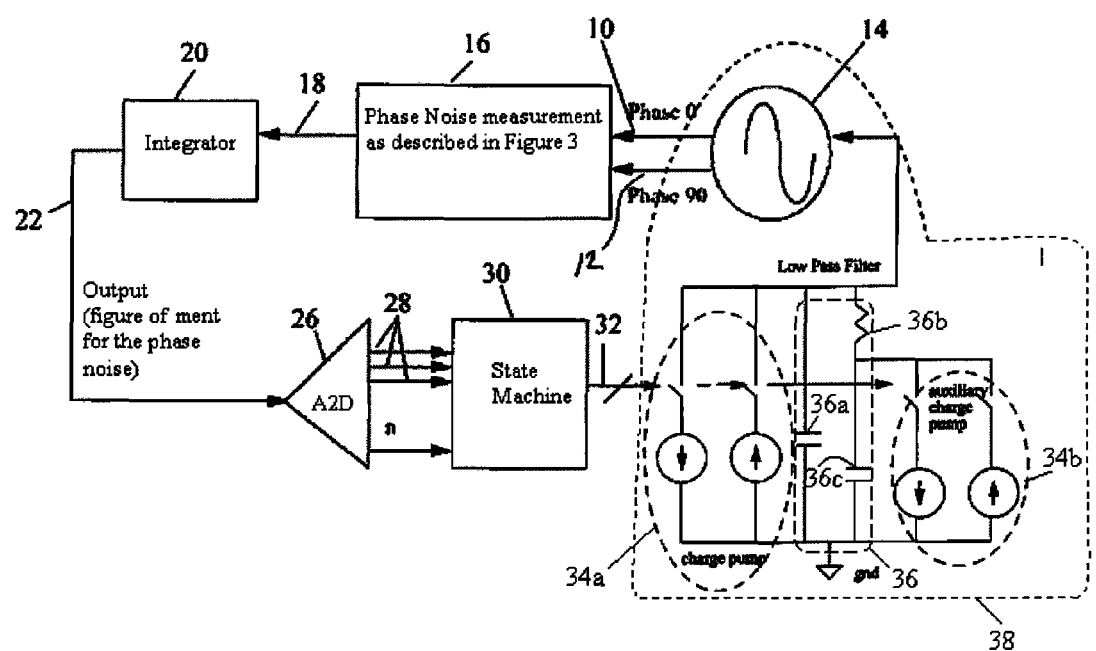
FIG. 1 is a high level diagram of a phase lock loop circuit, used in a transceiver environment for generating clock signals showing, at a high level, circuitry connected to the output of an oscillator and input of a charge pump to control the amount of charge added to or subtracted from the charge pump to control the bandwidth output by the oscillator and thereby reduce jitter in the phase lock loop circuit.

FIG. 1 depicts the overall concept of this disclosure. Zero and ninety degree phase clocks 10, 12 coming out of a clock oscillator 14 are fed into a phase noise measurement block 16 described infra, which outputs a signal 18 to integrator 20. Output 22 of integrator 20 is used as the figure of merit for the phase noise energy content of clock signal as will be described. Output 22 is fed into an analog to digital converter 26. Digitized output 28 of converter 26 is used by a state machine 30 to generate control bits 32 for charge pumps 34a and 34b (collectively charge pump 34) which, together with oscillator 14 and low pass or loop filter 36, constitute a phase lock loop 38. FIG. 1 depicts the primary charge pump 34a and auxiliary charge pump 34b and the loop filter 36. The auxiliary charge pump 34b has current sources that can be increased or decreased by the control bits coming out of the state machine. (The two circles depicted in each of 34a and 34b of the primary and auxiliary charge pumps represent but a single charge pump in each case, but show adding or subtracting a charge by the pump.) Hence, the bandwidth controls jitter. The state machine can also control the auxiliary charge pump. The loop filter is a second order loop filter 36 comprising a dominant pole setting capacitor 36a, zero setting resistor 36b and a ripple capacitor 36c. The loop filter 36 output-controls the oscillation frequency of the oscillator. The control bits 32 can either increase or decrease the current in charge pump 34 and, hence, the bandwidth. The state machine 30 goes through all the states sequentially and determines which state provides the lowest phase noise. That state is used as the final setting for the charge pump 34 which, as stated above, reduces jitter.

The jitter in a PLL 38 is dominated by the phase noise energy density S_phi of the carrier, with the close carrier noise being the dominant portion of the noise. Integration of this energy density within a window with lower boundary given by the clock data recovery (CDR) loop bandwidth and the upper boundary given by ½ of the bit frequency gives a measure of the total relevant jitter energy. The integration window is extended by −20 dB/dec slope outside the window. It should be noted that the phase noise density for large offsets from the carrier is dominated by thermal white noise and, therefore, flat. Integrating phase noise above that offset is not delivering insight in the PLL performance.

One embodiment of the present invention envisions applying a measurement to that energy to derive a figure of merit for the adjustment of the loop characteristics of the PLL 38 in an I/O link system towards an optimum configuration. The following describes one embodiment of how this can be implemented.

Feedback of phase noise measurement is used as an auxiliary charge pump to provide a technique to tailor the noise rejection of the PLL 38 loop. (It should be noted that the prior art did not measure or adjust to provide phase noise minimization.) The control bits 28 of the present invention can increase or decrease the charge pump current and, hence, the bandwidth and thus control jitter. The state machine goes through all the states sequentially and determines which state provides the lowest phase noise. That state is used as the final setting for the charge pump.

Figure 2:
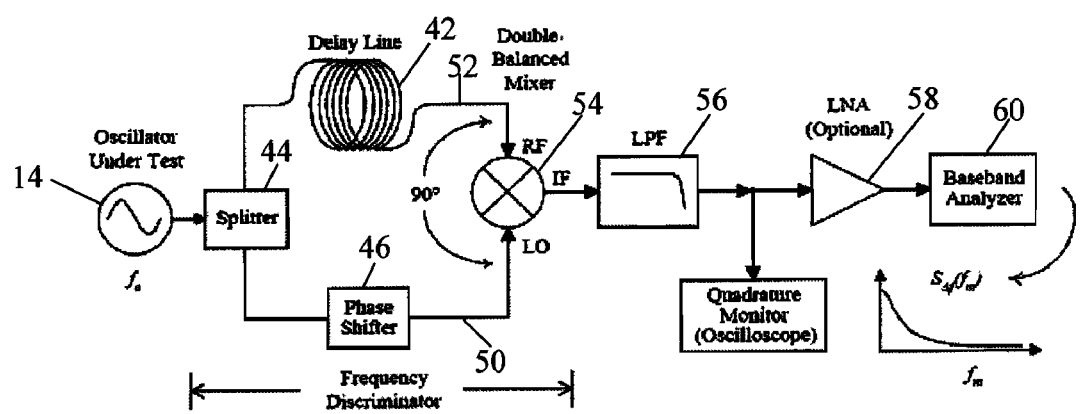
FIG. 2 is an integration of the phase noise.

FIG. 2 depicts an integration window of the phase noise. One well known principle for the measurement of phase noise is based on the fact that when multiplying a signal with a copy of the signal that is shifted by 90 degrees, the resulting output has components around zero frequency (DC) and 2× the input signal frequency. If a low pass filter and integration stage are added after the multiplication stage, the resulting output value is a measure for the phase noise.

FIG. 2 is a block diagram of such a measurement implementation, where the 90 degree phase shift is generated by means of a delay line 42 (delay line phase noise measurement technique). The signal from a clock oscillator 14 under test is split into two equal parts by a splitter 44. One is delayed in a delay line 42 for some time, while the other is fed through a phase shifter 46 which is programmed in such a way as to achieve 0/90 degree phase relationship between the two paths 50, 52. The two portions of the equivalent signal from paths 50, 52 are fed into a mixer 54, a low pass filter 56 and, after optional amplification in an amplifier 58, into a baseband analyzer 60 which is basically the integrating device 20. (The splitter 44, delay line 42, phase shifter 46 and mixer 54 constitute a frequency discrimination circuit.) In this general phase noise measurement system, the delay line 42 is made long enough to de-correlate the noise effects in the two signals 50, 52 that are input to the mixer 54. A quadrature monitor 62, preferably in the form of an oscilloscope, may optionally be placed in the line between the filter 56 and amplifier 58.

It is important to understand that if only a figure of merit for the phase noise (and not the exact value of the phase noise) needs to be determined, the delay line can be omitted. It is then sufficient to ensure proper 0/90 degree phase relationship at the input of the mixer 54. If the oscillator 14 has in-phase and quadrature outputs (for reason of phase interpolation in the CDR loop), these phases can be directly used as inputs to the mixer 54.

In particular, even if the noise in the two input signals to the mixer 54 are highly correlated, the mixer output above DC will be a cross-correlation of the noise frequency components applied to the input, plus a DC value that corresponds to the auto-correlation. It will be obvious to those skilled in the art that if the cross-correlation of noise density components is growing, the autocorrelation is growing as well. Consequently, it is sufficient to determine the cross-correlation for the generation of a control signal (figure of merit) in a control loop that adjusts PLL characteristics.

Due to the fact that the noise components are typically very small and due to the fact that it is very difficult to implement integrators in CMOS integrated circuits, it is not realistic to assume that the DC (noise auto-correlation) value can be used. However, the cross-correlation values that are not at DC can be amplified before being fed to an integrator and, therefore, offset problems in the integrator can be avoided.

Figure 3:
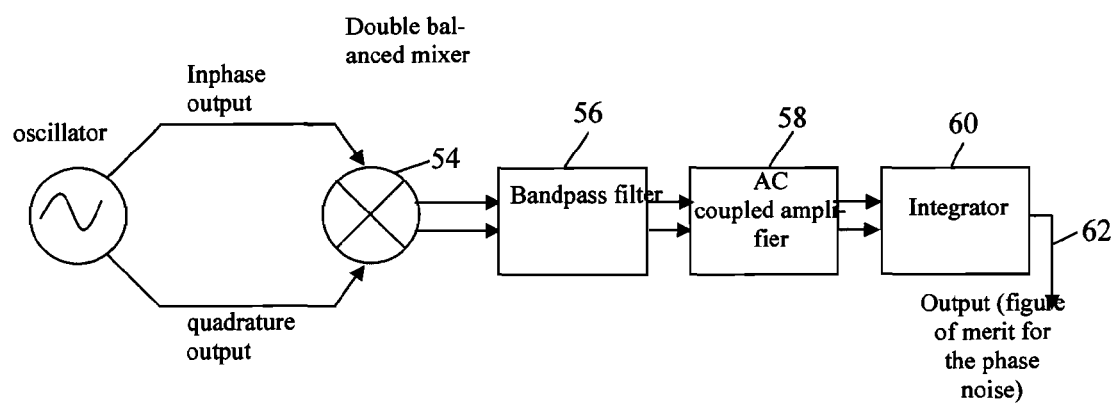
FIG. 3 is a more detailed view of the action of the charge pump in response to the state machine.

FIG. 3 shows a block diagram for the measurement of the cross-correlation of the phase noise frequency components. The in-phase and quadrature output signals of an oscillator 14 are applied to a mixer 54. The mixer 54 is connected to a band pass filter 56 followed by an AC coupled amplifier 58. The output of the amplifier is connected to an integrator 60 which sums all frequency components above DC and outputs a figure of merit 62 for the phase noise energy as described above. This signal can be used in a control loop to adjust certain aspects of the PLL 38 (such as its loop bandwidth, VDD, etc.) to minimize the figure of merit and, therefore, the phase noise. This will result in an optimum jitter at the output of the PLL 38.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A method of providing a jitter control in a transceiver system comprising the steps of:
   providing a phase lock loop circuit having an oscillator, a charge pump connected to said oscillator to add or subtract chare to or from a low pass filter which generates a control signal for the said oscillator, and
   providing circuitry connected to the output of said oscillator to measure phase noise and connected to the input of said charge pump to control the amount of auxiliary current to change the bandwidth of the phase lock loop and thereby reduce its jitter.

2. The method as claimed in claim 1 wherein the circuitry connected to the oscillator includes circuitry to output a figure of merit.

3. The method as claimed in claim 2 wherein the circuitry connected to the oscillator and the charge pump includes a state machine connected to receive the figure of merit and deliver a signal to the charge pump.

4. The method as defined in claim 3 wherein an analog to digital (A to D) converter is in circuit relationship to receive said figure of merit and deliver a signal to said state machine.

5. The method as defined in claim 4 wherein an integrator is provided in said circuitry between said oscillator and said charge pump to deliver said figure of merit to the A to D converter.

6. The method as defined in claim 1 wherein said circuitry connected to the output of said oscillator measuring phase noise comprises a phase noise circuit which supplies a measure of the phase noise.

7. The method as defined in claim 6 wherein said phase noise measurement circuit includes a bandpass filter connected to a double balanced mixer.

8. The method as defined in claim 7 wherein said noise measurement circuit includes an AC amplifier connected to the output of said bandpass filter.

9. The method as defined in claim 8 wherein a delay line is provided as input to said double balanced mixer.

10. The method as defined in claim 9 wherein said oscillator has a splitter attached to the output thereof, and one half of the output thereof is delivered to said delay line and the other half of the output of said oscillator is delivered to a phase shifter, and the outputs of both said delay line and said phase shifter are delivered as inputs to said double balanced mixer.

11. A method of providing jitter control in a transceiver system, comprising the steps of:
   providing a phase lock loop circuit having an oscillator, a charge pump connected to said oscillator to add or subtract charge to or from a low pass filter which generates a control signal for the said oscillator; and
   providing circuitry connected to the output of said oscillator to output a figure of merit, an analog to digital (A to D) converter in circuit relationship to receive said figure of merit, and the input of said charge pump to control the amount of auxiliary current to change the bandwidth of the phase lock loop and thereby reduce its jitter.

\* \* \* \* \*